United States Patent [19]

Nossen

[11] 4,206,424
[45] Jun. 3, 1980

[54] DIGITIZED PHASE MODULATING MEANS

[75] Inventor: Edward J. Nossen, Cherry Hill, N.J.

[73] Assignee: RCA Corporation, New York, N.Y.

[21] Appl. No.: 948,105

[22] Filed: Oct. 3, 1978

[51] Int. Cl.² ............................................. H03K 7/06
[52] U.S. Cl. .................................. 332/9 R; 332/16 R; 375/67
[58] Field of Search ......................... 332/9 R, 16 R; 325/38 R, 45, 141, 145; 178/67

[56] References Cited

U.S. PATENT DOCUMENTS

| | | | |
|---|---|---|---|
| 2,430,139 | 11/1947 | Peterson | 325/141 X |
| 3,689,914 | 9/1972 | Butler | 340/347 DA |
| 4,049,909 | 9/1977 | Peck | 325/145 X |

OTHER PUBLICATIONS

V. F. Volertas et al., "Phase Modulation Techniques for Digital Communication Systems," International Telecommunications Conference Proc., 10-9-77, p. 6.

*Primary Examiner*—Siegfried H. Grimm
*Assistant Examiner*—Edward P. Westin
*Attorney, Agent, or Firm*—H. Christoffersen; Samuel Cohen; Donald W. Phillion

[57] ABSTRACT

A digitalized phase modulating means in which a two level binary modulated sequence from a data source of bit rate $f_s$ is supplied to a pulse add/delete circuit. Also supplied to such pulse add/delete circuit is a train of clock pulses of frequency $C_a$, and a train of add/delete pulses having a repetition rate $mkf_s$, where m and k are integers. The pulse add/delete circuit responds to a binary bit of value 1 or 0 to add or delete the said add/delete pulses to the train of clock pulses at a given rate, such as mk pulses per data bit period $1/f_s$. The altered clock pulse train is then supplied to a divider which divides by 4k to produce a cyclical output whose phase is advanced or retarded by $\frac{1}{4}k$ of 360° each time a pulse is added or deleted from the clock pulse train $C_a$. By changing the value of k and by either only adding pulses to, or by only deleting pulses from, the clock pulse train, or by both adding and deleting pulses, several different forms of phase modulation can be effected.

6 Claims, 8 Drawing Figures

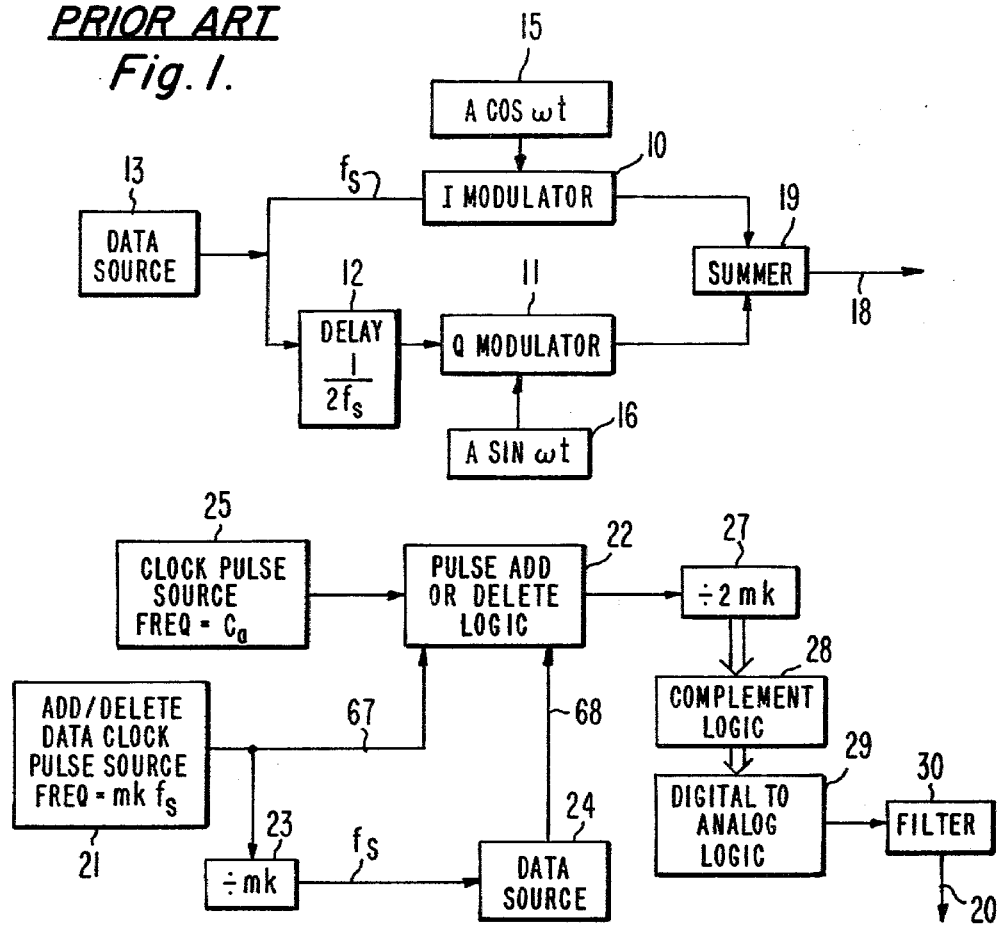
*PRIOR ART*
Fig. 1.
Fig. 2.
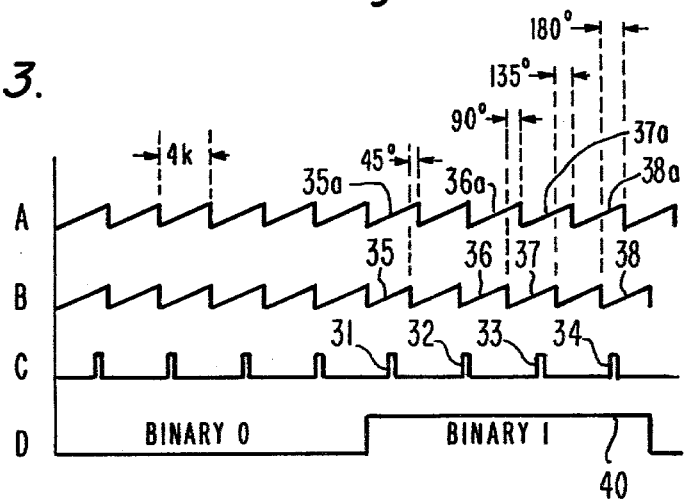
Fig. 3.

DIGITIZED PHASE MODULATING MEANS

This invention relates generally to phase modulating means and more particularly, to digital means for effecting phase modulation of various types.

Many analog systems are presently known for generating various types of phase modulation such as, for example, unidirectional phase shift keying (UPSK), orthogonal unidirectional phase shift keying, binary phase shift keying (BPSK), conventional quadrature phase shift keying (CQPSK) or offset keyed-quadrature phase shift keying (OKQPSK).

A principal disadvantage of such analog circuits is the inability to control the phase relationship of the needed quadrature carrier signals or the quadrature data signals with sufficient precision. More specifically, the phases of the I and Q carrier signals can easily vary from their desired 90° angular difference by 2° or 3°, which can introduce a substantial amount of spurious signal into the modulation process, with resulting substantial demodulation problems.

In one preferred form of the invention, there is provided means for generating a train of carrier clock pulses of frequency $C_a$, means for generating a train of add/delete pulses of frequency $mkf_s$, where k and m are integers, means for producing a two-level binary modulation sequence signal which changes its state of modulation at the data rate $f_s$, and a pulse add/delete circuit responsive to the state of modulation of the binary modulation sequence to alter the pulse rate of the train of clock pulses during each bit period $1/f_s$ by adding pulses to, or deleting pulses from, said train of clock pulses during said each bit period $1/f_s$ at a rate which is some integral multiple or integral submultiple m of $kf_s$. A divider divides the altered train of clock pulses by 4k with the cyclical output of said divider being shifted in phase by the added or deleted pulses in an amount equal $mk/4k$. A digital-to-analog converting means is responsive to the cyclical count value of said divider to generate a cyclical signal whose frequency and phase are determined by the frequency and phase of said cyclical count value.

In the drawings:

FIG. 1 is a block diagram of an analog prior art structure;

FIG. 2 shows a block diagram of one form of the invention;

FIG. 3 is a set of waveforms illustrating the phase shift of the output signal of the structure of FIG. 2 in response to a binary 1 data bit input;

Figure 4:
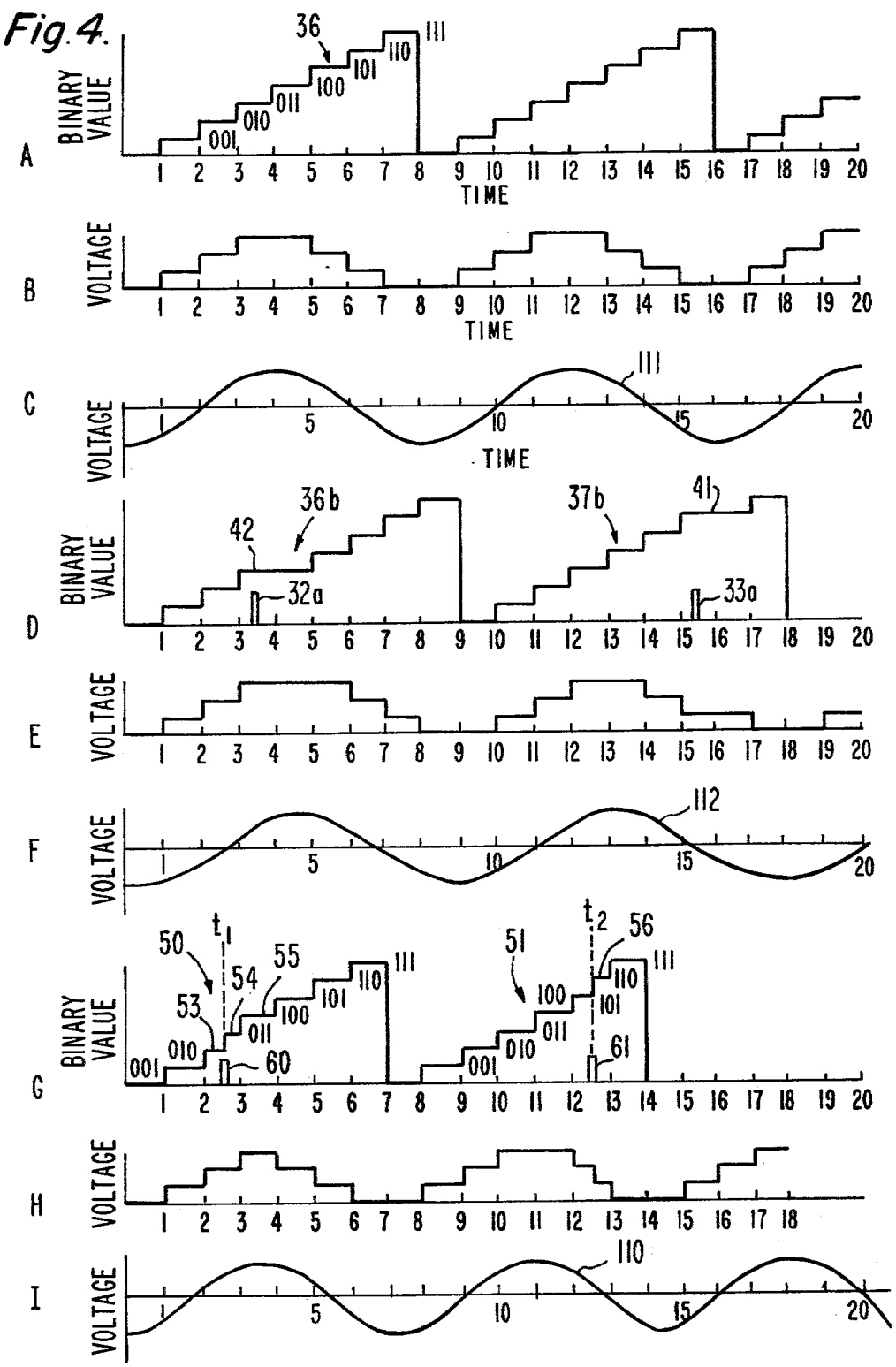
FIG. 4 is a series of waveforms illustrating the signal as it appears at various points and under various conditions in the structure of FIG. 2 and, more specifically, it shows the signal without a change in phase, the signal with the phase advanced, and the signal with the phase retarded.
Figure 5:
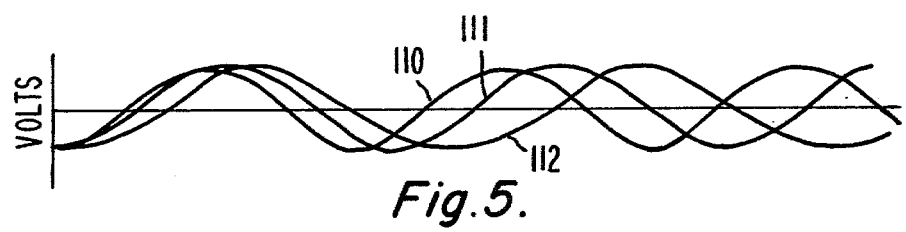
FIG. 5 shows superimposed waveforms of the filtered signal outputs of the structure of FIG. 2 with the phase unchanged, advanced, and retarded.

Differentially coherent unidirectional phase shift keying is accomplished by the prior art analog structure of FIG. 1. Differentially coherent UPSK is defined generally as a phase modulation of a carrier signal wherein the phase of said carrier signal is rotated 90° in one direction only twice during the occurrence of a binary 1 from a data source. In the structure of FIG. 1 the binary modulation sequence (from data source 13) is supplied directly to the in-phase (I) modulator 10 and also through $\frac{1}{2} f_s$ delay means 12 to quadrature (Q) phase modulator 11 at a bit rate $f_s$.

Also supplied to the I and Q modulators 10 and 11 are quadrature forms of the carrier signal (A cos ωt and A sin ωt) from signal sources 15 and 16. The I modulator 10 functions to invert the phase of the signal (A cos ωt) upon the occurrence of a bit 1 from data source 13. Such 180° shift in phase of the signal A cos ωt results in a 90° phase shift in the sum of the signals A cos ωt and A sin ωt which appears on the output 18 of summer 19.

Subsequently, when the data bit 1, delayed $\frac{1}{2} f_s$ by delay means 12, is supplied to Q modulator 11, the phase of the signal A sin ωt will be inverted 180° to shift the summed signals at the output 18 of summer 19 by another 90°, for a total shift of 180° in response to the bit 1. In response to a binary 0 supplied from source 13, the modulators 10 and 11 produce no phase change in either the signal A cos ωt or the signal A sin ωt. As indicated above, one problem with an analog structure of the type shown in FIG. 1 is the inability to produce signals such as A cos ωt and A sin ωt which are, in fact, phased 90° apart. Such desired phase difference can easily have an error of 2° to 3° which is reflected as spurious signals in the summed output signal.

Figure 6:
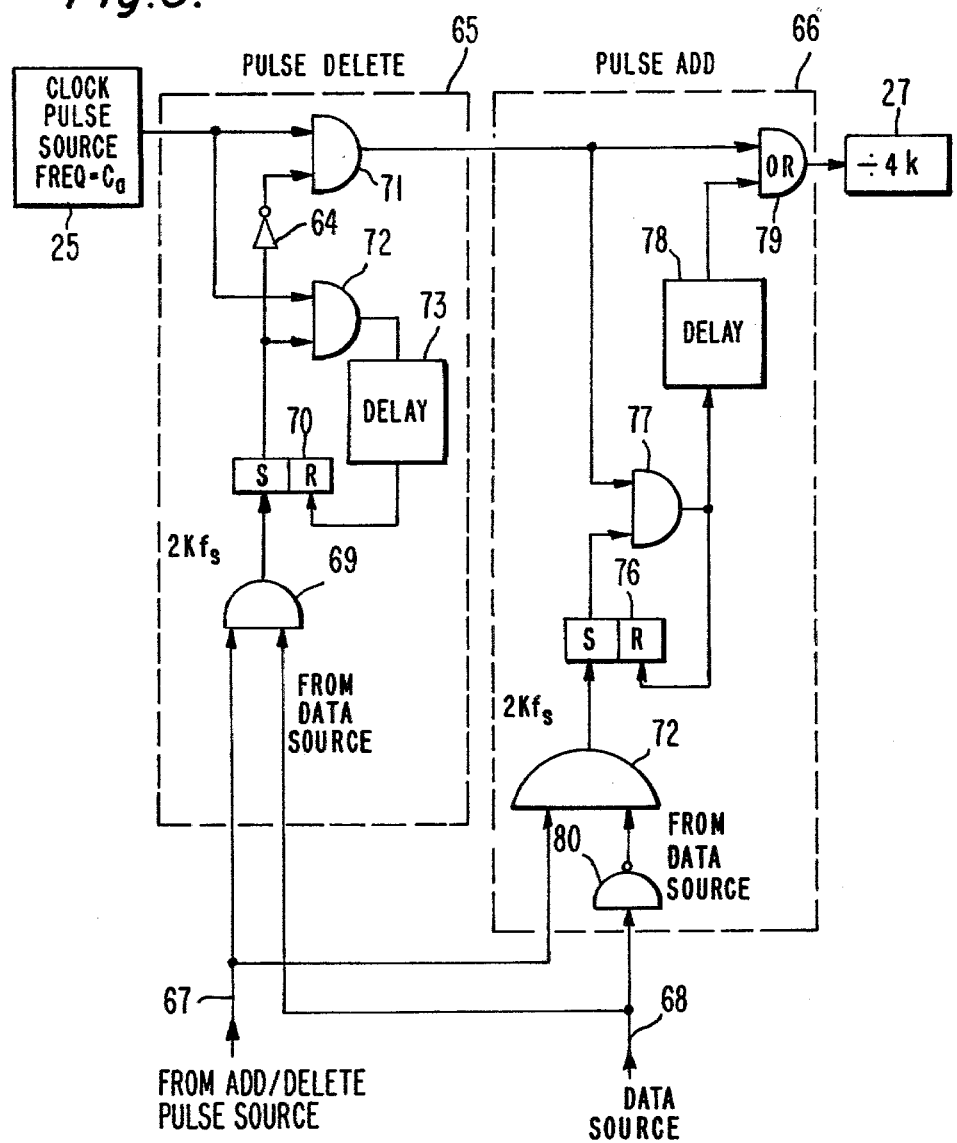
FIG. 6 is a logic diagram of a pulse delete and a pulse add circuit which can be employed in the structure of FIG. 2.

The digitized structure of the present invention, shown in FIG. 2, generates 90° phase shifts in the output signal appearing on output lead 20, which phase shifts are precise within a fraction of a degree because of the digitized structure. In FIG. 2 an add/delete pulse source 21 supplies a train of pulses having a repetition rate of $mkf_s$ to pulse add/delete logic 22 and to divide by mk logic 23. The pulse add/delete logic 22 responds to a binary 1 or a binary 0 (supplied thereto from data source 24 in the form of a two level binary sequence) to add or delete mk pulses to or from the train of clock pulses applied thereto from $C_a$ clock pulse source 25. A logic diagram of suitable add/delete logic is shown in FIG. 6 and will be described later herein.

The divide by 2mk logic 27, which can be a counter with a fill capacity of 2mk, responds to the altered $C_a$ clock pulse train supplied from pulse add/delete logic 22 to become filled every 2mk clock pulses. Each pulse deleted from the $C_a$ clock pulse train will lengthen the amount of time required to fill the divider-counter 27 by a time period $1/C_a$. Since the capacity of divider 27 is 2mk, the deletion of k pulses each bit period $1/f_s$ (when m=2) will shift the phase of the cycle time of divider 27 by 90° ($k/4k \times 360° = 90$), and the deletion of 2k pulses will shift said phase by 180°.

As indicated, the deletion of such 2k pulses must occur every data bit period $1/f_s$. Therefore, the repetition rate of pulses supplied from add/delete pulse source 21 to pulse add/delete logic 22 must be $2kf_s$. The output frequency of the pulse add/delete logic is then:

$$C_a - mkf_s$$

which is divided by 2mk in divider 27 to result in a fill-up rate of divider 27 as follows:

$$C_a/4k - f_s/2,$$

where m=2.
The number of fill-ups of divider 27 over the time period $1/f_s$ of a data bit is then;

$$C_a/4kf_s - \tfrac{1}{2}$$

showing that the phase of the output of divider 27 has shifted one half of a fill-up cycle over a data bit period $1/f_s$. Such a phase shift is, in fact, a phase shift of 180° which occurs in angular increments of 180°/2k for each fill-up cycle of divider 27, assuming that no more than one pulse deletion occurs in any fill-up of divider 27.

The effect of such deletion of pulses is shown broadly in FIGS. 3A, 3B, 3C and 3D and in more detail in FIGS. 4D, 4E and 4F. FIG. 3B shows the output of divider 27 in terms of the binary value contained therein when no pulses are either being added to or deleted from the $C_a$ clock pulse train from source 25 of FIG. 2. Specifically, each individual sawtooth waveform, such as sawtooth waveform 36, represents one fill-up cycle of divider 27 and is, in fact, a stepped waveform (in terms of binary value), as shown in the stepped waveform 36 of FIG. 4A. There are eight discrete steps in waveform 36, since k and m are both assumed to be equal to 2. The divider 27 has three bit positions.

The waveform of FIG. 3A shows the resultant output of divider 27 of FIG. 2 when pulses have been deleted from the $C_a$ clock pulse train from source 25 in response to the occurrence of a bit 1, indicated by reference character 40 in the waveform of FIG. 3D. Specifically, the pulse add/delete logic 22 of FIG. 2 responds to the four add/delete pulses 31, 32, 33 and 34 of FIG. 3C to delete four $C_a$ clock pulses supplied from source 25, thus lengthening the fill-up time of divider 27 by a time interval $1/C_a$ for each of the four fill-up cycles 35, 36, 37 and 38 of FIG. 3B, resulting in the lengthened four fill-up cycles 35a, 36a, 37a and 38a shown in FIG. 3A. Each cycle is lengthened by the time interval $1/C_a$, resulting in a total time shift of $4/C_a$ over the period of binary bit 40 of FIG. 3D. Such a time shift represents a total phase shift of 180° which occurs in four increments of 45°.

The stepped waveforms 36b and 37b of FIG. 4D are enlarged binary representations of the waveforms 36a and 37a of FIG. 3A. Also shown in FIG. 4D are delete pulses 32a and 33a which correspond to delete pulses 32 and 33 of FIG. 3C. The pulse add/delete logic 22 responds to the pulses 32a and 33a of FIG. 4D to each delete the immediately following $C_a$ clock pulse, which occur at clock times 4 and 16, and thereby on two occasions, leave the count in divider 27 at the same value for two consecutive $C_a$ clock periods $1/C_a$. Thus, the two plateaus 42 and 41 are formed in the stepped waveforms 36b and 37b, each of which has a time length of two periods $1/C_a$, resulting in the total fill-up time of divider 27 to increase from $8/C_a$ to $9/C_a$ for each of the waveforms 36b and 37b, and thereby shifting the phase of the fill-up cycle of divider 27 by two 45° increments.

Similar 45° phase shifts are introduced in the sawtooth waveforms 35 and 38 of FIG. 3B by delete pulses 31 and 34 to produce the lengthened waveforms 35a and 38a of FIG. 3A. Thus, the phase of the count cycle of divider 27 is shifted 180° in four 45° increments during the time period of bit 40.

The binary values generated at the output of divider 27 are supplied to complement logic 28 where the necessary complementing is done to provide a set of binary values representative of an approximated sine wave. The waveform of FIG. 4E is, in fact, the voltage waveform generated by digital-to-analog converter 29 in response to the complemented set of binary values supplied thereto from complement logic 28 of FIG. 2. Filter 30 is responsive to the stepped waveform of FIG. 4E to provide the sine wave of FIG. 4F.

It is apparent that the output of divider 27 forms the carrier signal of the binary data modulation sequence with the cycle rate of said divider 27 being the frequency of said carrier signal. It is also apparent that the smallest increments of phase shift of divider 27 output is determined by the ratio of the number of $C_a$ clock pulses deleted per data bit period to the count capacity of divider 27. Accordingly, if such count capacity is 32 (k=8, m=2), each $C_a$ clock pulse deleted will produce a phase shift of the output of divider 27 equal to $1/32 \times 360° = 11.25°$, so that 16 $C_a$ clock pulse deletions will result in a total phase shift of the cyclical output of divider 27 of 180° ($16 \times 11.25° = 180°$).

If desired, unusual values of phase shift can be obtained by making the count of divider 27 equal to values other than $2^p$, where p is an integer. For example, the count can be 17 or 25, or any other number. If the divider 27 has a total count of 17, then each deleted clock pulse will produce a phase shift of $360° \div 17$.

Further, the count value of divider 27 can be made high so that each incremental phase shift caused by the deletion of a $C_a$ clock pulse is very small, thus minimizing the spurious signals which would be caused by large discrete phase shifts.

In certain types of phase modulation the phase will change in only one direction in response to either a binary 1 or a binary 0, but not both. One such system is differentially coherent UPSK, defined hereinbefore, in which the system phase can either advance (the addition of pulses) or the phase can retard (the deletion of pulses), but not both, in response to either a binary 1 or a binary 0.

In other types of phase modulation the phase can both advance and retard, depending on whether a binary 1 or a binary 0 is being modulated. Further, such phase advances or retardations can be gradual or discrete, i.e., in either very small angular amounts or in angular amounts of 90° or 180°, depending on the type phase modulation being effected.

Up to this point, pulse deletion has been primarily discussed as a means of causing phase shift in the output of divider 27. Consider now pulse addition as a means of such phase shift. Reference is made to FIGS. 4G, 4H and 4I which show waveforms at the outputs, respectively, of divider 27 of FIG. 2, digital-to-analog converter 29 and filter 30.

As mentioned above, suitable logic which can be employed to add pulses to the $C_a$ clock pulse train in the pulse add/delete logic 22 of FIG. 2 is shown in detail in FIG. 6 and will be discussed later herein. For present purposes assume that the add pulses 60 and 61 of FIG. 4G are supplied from add/delete pulse source 21 to pulse add/delete logic 22, and will each result in an additional pulse being inserted into the $C_a$ clock pulse train from source 25. Each such add pulse will shorten the fill-up time of divider 27 by a time interval $1/C_a$. More specifically, the add pulse of FIG. 4G results in a change in the binary value from 010 to 011 in divider 27 at time $t_1$ whereas such change in binary value ordinarily would have been generated in response to the $C_a$ clock pulse occurring at time 3 in FIG. 4G. Such $C_a$ clock pulse occurring at time 3 will now cause another change in the binary value in divider 27, e.g., from 011 to 100. Thus, the fill-up time of divider 27 has been shortened by a time period $1/C_a$ and occurs as a result of $C_a$ clock pulse at time 7 in FIG. 4G instead of the $C_a$ clock pulse occurring at time 8.

Similarly, add pulse 61 in FIG. 4G increases the binary value of divider 27 to a binary 110 whereas, in the absence of said add pulse 61, the $C_a$ clock pulse occurring at time 13 would have effected such increase in binary value. By virtue of add pulse 61, the fill-up time of divider 27 is shortened by a time interval $1/C_a$. Such fill-up now occurs as a result of the $C_a$ clock pulse generated at time 14 rather than the $C_a$ clock pulse generated at time 15.

Thus, in the two fill-up count cycles 50 and 51 of divider 27 shown in FIG. 4G, the phase of cycling of divider 27 has been advanced by two $C_a$ clock pulses, or a time interval $2/C_a$, which is equal to two 45° phase shifts for a total of 90° phase shift during a given bit period. It is apparent that if two additional add pulses are supplied to add/delete logic 22 of FIG. 2 during the same bit period, the total phase shift delay for such bit period will be 180°. As in the case of the deletion of $C_a$ clock pulses, the count capacity of divider 27 can be made high so that each added pulse represents only a small increment of phase shift, thus minimizing spurious signal generation. Further, the $C_a$ clock frequency can be large compared to that of the add/delete pulse source so that only one pulse will be added in a single count cycle of divider 27.

In FIG. 6 suitable logic is shown for performing the pulse add/delete function 22 of FIG. 2. Specifically, the pulse delete logic is shown within block 65 and the pulse add logic within block 66. The value m is assumed equal to 2.

Considering the pulse delete logic 65 first, AND gate 69 will conduct pulses from add/delete pulse source 21 of FIG. 2 via lead 67 when a binary 1 data bit is also supplied to AND gate 69 from data source 24 of FIG. 2 via lead 68. Flip-flop 70 is set by the output of AND gate 69 to in turn prime AND gate 72 to become conductive upon the occurrence of the next $C_a$ clock pulse from source 25, and through INVERTER 64 to inhibit AND gate 71 from passing such next $C_a$ clock pulse. Thus, the said next occurring $C_a$ clock pulse will pass through AND gate 72, and then through one half clock pulse period delay means 73 to reset flip-flop 70. Resetting of flip-flop 70 disables AND gate 72 and primes AND gate 71 to pass subsequent $C_a$ clock pulses therethrough and then through OR gate 79 to divider 27. The result of the foregoing logic is that a single $C_a$ clock pulse has been deleted from the train of $C_a$ clock pulses. Each subsequent delete clock pulse from source 21 will result in the deletion of an additional $C_a$ clock pulse.

Consider now the pulse add logic 66. A binary 0 from data source 24 (FIG. 2) via lead 68 is inverted by inverter 80 to prime AND gate 72 to pass pulses from add/delete pulse source 21 of FIG. 2 via lead 67. Each such add/delete pulse will set flip-flop 76 to thereby condition AND gate 77 to pass the next $C_a$ clock pulse therethrough, then through one half $C_a$ clock pulse period delay means 78, and then through OR gate 79 to divider 27. The same $C_a$ clock has, by that time, already passes directly through AND gate 71, and OR gate 79 to divider 27. Thus, the clock pulse passing through AND gate 77, delay means 78 and OR gate 79 is an added pulse to the consecutive regularly occurring $C_a$ clock pulses.

With the addition of pulses to the clock train during the present of one type of bit, such as a binary 0, and the deletion of pulses from the clock train during the presence of a binary 1, several types of phase modulation can be effected, some of which are set forth below.

Minimum shift keying (MSK) can be accomplished. In MSK the phase is continuously shifting through 90° phase increments in either direction in accordance with whether a binary 1 or a binary 0 is being encoded. In this type modulation, the frequency of the output of add/delete pulse source 21 is $2kf_s$, and the divider 27 count is 4k. The value of k should be large, of the order of $2^6$ or greater, to provide a substantially continuous phase shift.

Unidirectional phase shift keying (UPSK) can be accomplished. In one form of UPSK (differentially coherent UPSK), the phase of the carrier signal (output of divider 27) is shifted in two 90° increments in one direction in response to a binary 1, and not at all in the other direction in response in response to a binary 0. The frequency of the output of add/delete pulse source 21 of FIG. 2 is $2f_s$ and the count of divider 27 is 4, with two pulses being added to the $C_a$ clock train or two pulses being deleted from the clock train during each binary 1.

By means of relatively small changes, the circuits of FIGS. 2 and 6 can accomplish orthogonal (differentially coherent) UPSK, a form of phase modulation wherein bits of one value, such as binary 1's, are employed to change the phase of the cyclical count of divider 27 in one direction for a predetermined number R of data bits, and then in the opposite direction for R bits, and then again in the first direction for R bits, and so on in alternate manner, thus resulting in an average frequency change of zero.

Figure 7:
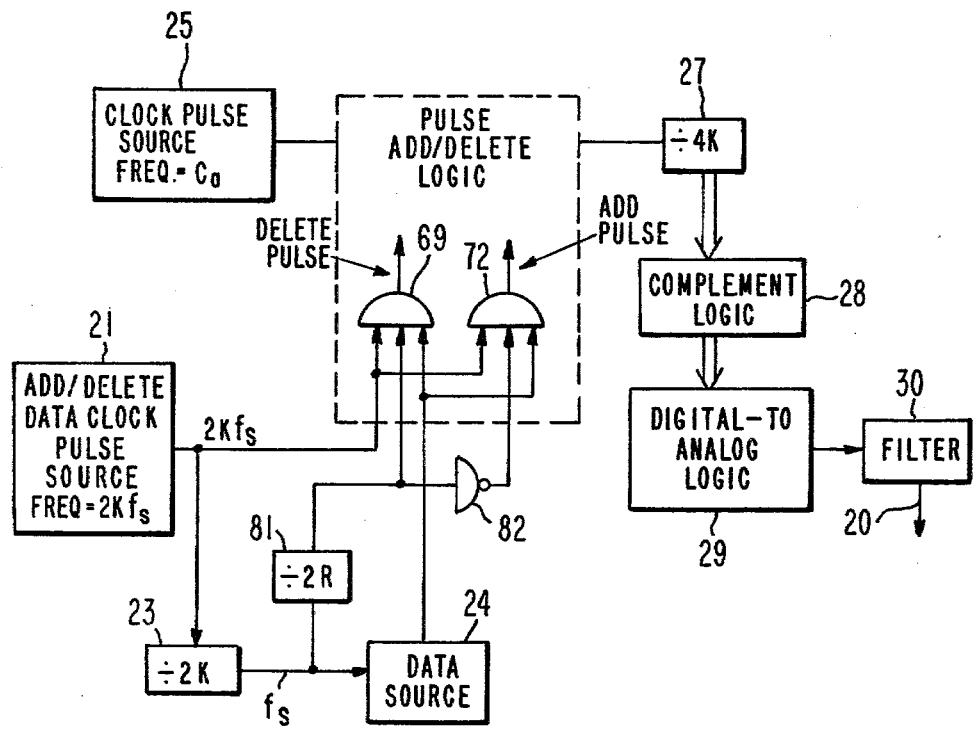
FIG. 7 is a block diagram of a form of the invention adapted primarily to effect orthogonal UPSK.

The changes of logic required to execute orthogonal UPSK are shown in FIG. 7, which is a combination of the structures of FIGS. 2 and 6. Specifically, the divider 81 has been added to FIG. 7 while the INVERTER 80 of FIG. 6 has been replaced with INVERTER 82. AND gates 69 and 72 have three inputs rather than two.

The divider 81 responds to the add/delete pulses from source 21 to alternately condition AND gates 69 and 72 to pass delete or add pulses from source 21 every R counts of divider 81. Specifically, the most significant bit of divider 81 alternates between a binary 1 and a binary 0 every such 2R counts and is employed to alternately condition AND gates 69 and 72. Thus, the add/delete pulses from sources 21 will be supplied alternately to the pulse delete circuit 65 of FIG. 6 and to the pulse add circuit 66 of FIG. 6 every 2R counts of divider 81 of FIG. 7.

Figure 8:
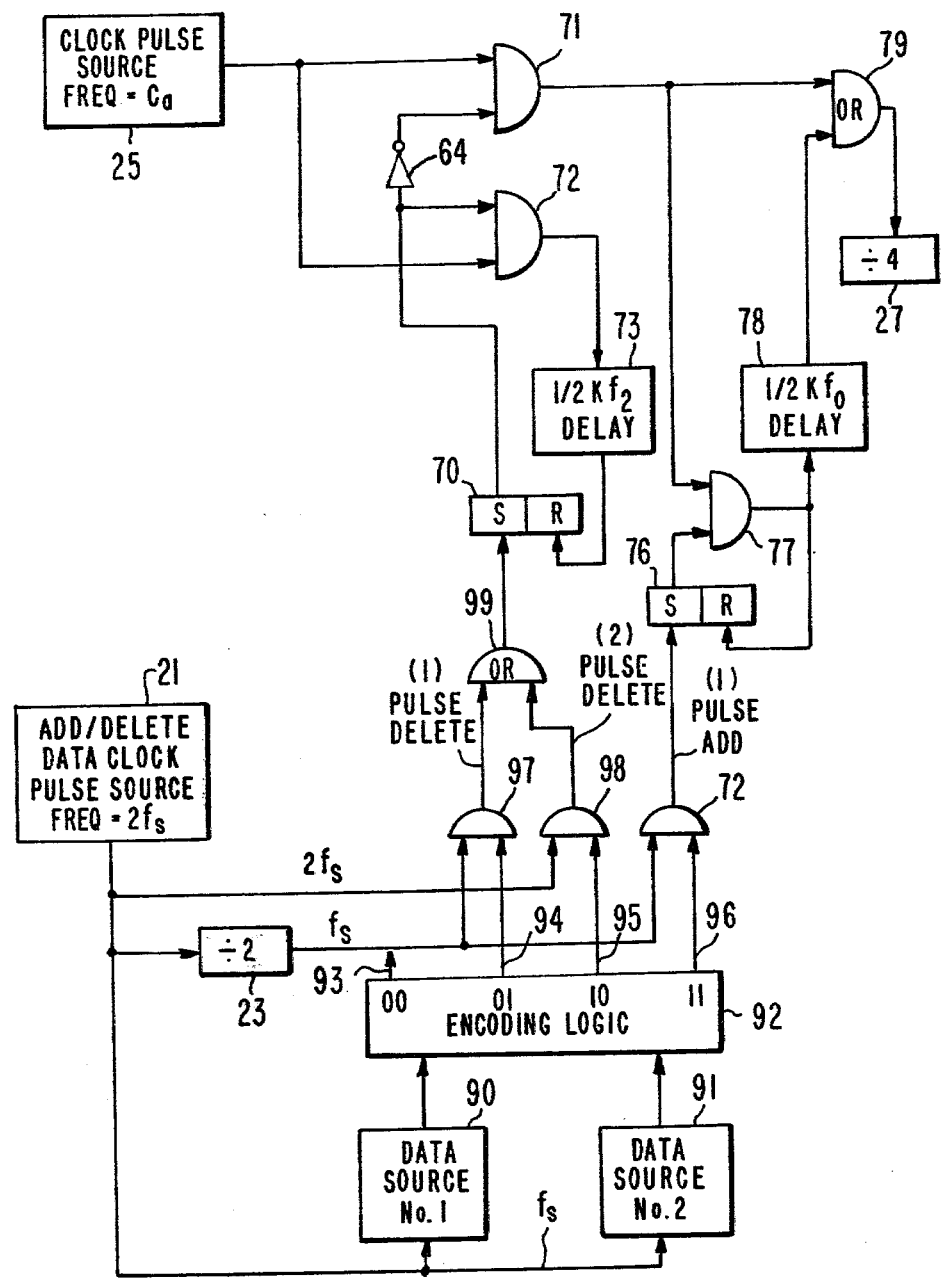
FIG. 8 is a combined block and logic diagram of a form of the invention adapted to effect quadraphase modulation.

In FIG. 8 there is shown a form of the invention which effects quadra-phase modulation, of the type wherein each new phase shift uses the last, i.e., the immediately preceding phase position of the carrier, as a reference phase (differentially coherent quadraphase). Quadra-phase modulation is usually employed to modulate bits at a time and to encode them in one of four possible phase states of the carrier. The foregoing is accomplished by the structure of FIG. 8 as follows, in which k=1.

The outputs of the two data sources 90 and 91 are supplied to encoding logic 92 which activates one of four output leads 93, 94, 95 or 96, depending on whether data sources 90 and 91 contain binary permutations 00, 01, 10 or 11, respectively. Output lead 93, representing the binary permutation 00 state of data sources 90 and 91, is not connected to any circuit and neither adds or deletes pulses from the $C_a$ clock pulse train from source 25.

Lead 94, in response to the binary permutation 01 state of data sources 90 and 91, conditions AND gate 97 to pass one $f_s$ add/delete pulse therethrough from divider-by-two logic 23. Said $f_s$ pulse passes through OR gate 99 to set flip-flop 70, thus inhibiting AND gate 71 through INVERTER 64 and conditioning AND gate 72 to be opened. The next occurring $C_a$ clock pulse from source 25 will therefore not pass through AND gate 71 but will pass through AND gate 72 and delay means 73 to reset flip-flop 70, thus inhibiting AND gate 72 and conditioning AND gate 71 to pass subsequently occurring $C_a$ clock pulses. Since there is but one delete $f_s$ pulse (k=1), only one $C_a$ clock pulse is deleted from the $C_a$ clock pulse train to shift the phase of the output of divider 27 by 90°.

If the data sources 90 and 91 contain a binary 1 and a binary 0, respectively, i.e., a binary permutation 10, the AND gate 98 will become conditioned to pass two $f_s$ add/delete pulses therethrough to flip-flop 70 to cause two clock pulses $C_a$ to be deleted from the $C_a$ clock pulse train and thereby shift the phase of the cyclical output of divider 27 by 180°, in two 90° steps.

If the data sources 90 and 91 contain the binary permutation 11, AND gate 72 will become conditioned to pass one $f_s$ add/delete pulse to set flip-flop 76 and thereby condition AND gate 77 to pass the next $C_a$ clock pulses therethrough and then through delay means 78 and OR gate 79 to divider 27. Thus, an extra clock pulse has been added into the $C_a$ clock pulse train to advance the phase of the output of divider 27 by 90°.

In summary, the phase shifts which occur in response to the four possible binary permutations of data sources 90 and 91 are as follows, with each phase shift using the immediately preceding phase of the output of divider 27 as a reference phase.

| Binary Permutation | Phase Shift |
| --- | --- |
| 00 | 0° |
| 01 | −90° |
| 10 | −180° |
| 11 | +90° |

By making k equal to a value substantially greater than one, the resulting phase shifts will become relatively smooth transitions, as discussed above in connection with FIGS. 2–4.

What is claimed is:

1. Phase angle modulating means for phase angle modulating a received train of clock pulses, said means comprising:
   data source means for producing a binary modulated sequence representative of binary 1's and 0's having a bit rate $f_s$;
   signal source means for producing a train of second pulses at a frequency of $mkf_s$, where m and k are integers;
   logic means responsive to predetermined states of said binary modulated sequence to alter the pulse rate of said train of clock pulses at a rate equal to a multiple or submultiple of mk pulses per bit period;
   divider means comprising cyclical counter means for dividing the train of clock pulses by a divisor nk, where n is an integer, after said alteration of the pulse rate of said train of clock pulses; and
   logic comprising digital-to-analog converting means responsive to the count contained in said cyclical counter means to produce an output signal whose frequency and phase are proportional to the cyclical count of said counter means.

2. Phase angle modulating means as in claim 1 in which said logic means comprises:
   first logic means constructed, when activated, to respond to binary bits of a given value from said data source to add pulses to said train of clock pulses;
   second logic means constructed, when activated, to respond to binary bits of another value from said data source to delete pulses from said train of clock pulses; and
   switching means for selectively activating one of said first and second logic means to produce desired corrections in the waveform of said output signal.

3. Phase angle modulating means as in claim 1 in which said logic means is responsive only to the occurrence of binary digits of a given value from said data source to alter the pulse rate of said train of clock pulses.

4. Phase angle modulating means for phase angle modulating a received first pulse train and comprising:
   means for generating at least one binary modulated sequence at a bit rate $f_s$;
   means for generating a second pulse train of frequency $kf_s$, where k is an integer;
   first logic means responsive to said at least one binary modulated sequence and to said second pulse train to alter the pulse rate of said first pulse train mk pulses during predetermined bit periods of said at least one binary modulated sequence, where m is an integer;
   counting means for dividing said altered first pulse train by n, where n is an integer, to produce a cyclical sequence of binary values; and
   means responsive to said cyclical sequence of binary values to produce a cyclical voltage whose frequency and phase are determined by the frequency and phase of said cyclical sequence of binary values.

5. Phase angle modulating means as in claim 4 in which said first logic means comprises:
   add pulse logic means constructed, when activated, to respond to binary bits of 1 in said at least one binary modulated sequence to add pulses to said first pulse train;
   delete pulse logic means constructed, when activated, to respond to binary bits of 0 in said at least one binary modulated sequence to delete pulses from said first pulse train; and
   switching means responsive to each successive predetermined number of bit periods $1/f_s$ to alternately activate said add pulse logic means and said delete pulse logic means.

6. Phase angle modulating means as in claim 4 in which said first logic means is responsive only to the occurrence of predetermined states of said at least one binary modulated sequence to alter the pulse rate of said first pulse train.

* * * * *